United States Patent
Kim et al.

(10) Patent No.: US 8,067,816 B2
(45) Date of Patent: Nov. 29, 2011

(54) TECHNIQUES FOR PLACEMENT OF ACTIVE AND PASSIVE DEVICES WITHIN A CHIP

(75) Inventors: Jonghae Kim, Fishkill, NY (US); Shiqun Gu, San Diego, CA (US); Brian Matthew Henderson, Escondido, CA (US); Thomas R. Toms, Dripping Springs, TX (US); Matthew Nowak, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 150 days.

(21) Appl. No.: 12/364,844

(22) Filed: Feb. 3, 2009

(65) Prior Publication Data

US 2010/0193905 A1 Aug. 5, 2010

(51) Int. Cl.
*H01L 29/00* (2006.01)
(52) U.S. Cl. ........ 257/531; 257/532; 257/E21.705; 257/E27.046; 257/E27.048
(58) Field of Classification Search ........ 257/531, 257/532, E21.705, E27.046, E27.048
See application file for complete search history.

(56) References Cited

U.S. PATENT DOCUMENTS

| 6,236,103 B1 | 5/2001 | Bernstein |
| 2008/0001269 A1 | 1/2008 | Hsu |
| 2008/0315356 A1 | 12/2008 | Reisner |

FOREIGN PATENT DOCUMENTS

DE 102007009383 8/2008

OTHER PUBLICATIONS

International Search Report-PCT/ US2010/023070, International Search Authority-European Patent Office May 28, 2010.
Written Opinion-PCT/ US2010/023070, International Search Authority-European Patent Office May 28, 2010.

*Primary Examiner* — David S Blum
(74) *Attorney, Agent, or Firm* — Michelle Gallardo; Sam Talpalatsky; Jonathan T. Velasco

(57) ABSTRACT

A semiconductor die includes a semiconductive substrate layer with first and second sides, a metal layer adjacent the second side of the semiconductive substrate layer, one or more active devices in an active layer on the first side of the semiconductive substrate layer; and a passive device in the metal layer in electrical communication with the active layer. The passive device can electrically couple to the active layer with through silicon vias (TSVs).

13 Claims, 6 Drawing Sheets

TECHNIQUES FOR PLACEMENT OF ACTIVE AND PASSIVE DEVICES WITHIN A CHIP

TECHNICAL FIELD

The present disclosure relates to integrated circuits (ICs). More specifically, the present disclosure provides techniques for arranging active and passive devices within a semiconductor chip.

BACKGROUND

FIG. 1 is an illustration of a conventional CMOS design 100. The conventional design 100 includes a substrate 102 and raised metal layers M1 through Mn. The Redistributed Design Layer (RDL) 101, in this example, includes metal oxide and, thus, can also be referred to as a metal layer. The raised metal layers M1 through Mn are fabricated during back end of the line processes and are referred to as Back End of the Line (BEOL) layers 103.

An active layer 106 is fabricated upon the substrate 102 and includes active devices such as the NMOS transistor 107 and the PMOS transistor 108. The substrate processing and active device fabrication occur during front end of line processes and are referred to as Front End of the Line (FEOL) layers.

The design 100 also includes an inductor 110, which is fabricated in one of the raised metal layers M1 through Mn. Thus, the inductor 110 sits in the BEOL metal layer stack directly above the active layer 106. FIG. 2 shows a simplified version of the design 100 showing a placement of the inductor 110 within the BEOL metal layer stack. Within the active layer 106, the area 105 is the area directly below the inductor 110. It should be noted that as used herein, "above" and "below" do not indicate an up/down directional relationship, but rather refer to placement in the stack. For example, BEOL components are referred to as above the substrate 102 or above the active layer 106, whereas the RDL 101 is referred to as below the substrate 102.

In the conventional design 100, the area 105 experiences high levels of electromagnetic interference from the inductor 110 such that the area 105 is unsuitable for active devices. The area 105 represents a large portion of space on the substrate 102 upon which active devices could otherwise be fabricated. In fact, in some conventional designs, an area equal to A×B (see FIG. 1) in the active layer 106 is unusable, and in current designs, A×B may be in the range of 300 microns by 300 microns—an area large enough to accommodate about 1,000,000 transistors. Conventional designs often have increased die sizes in order to accommodate amounts of wasted space lost due to placement of inductors. Wasted die space translates to increased costs. Currently, there is no effective and available technique to limit the amount of wasted space caused by passive devices such as inductors other than to limit the use of passive devices.

BRIEF SUMMARY

Various embodiments of the present invention are directed to systems and methods which dispose a passive device (e.g., an inductor) on a different side of the substrate than the active devices (e.g., transistors). In one example, a semiconductor die includes a semiconductive substrate layer with first and second sides, a metal layer adjacent the second side of the semiconductive substrate layer, one or more active devices in an active layer, the active layer being a layer of the first side of the semiconductive substrate layer, and a passive device in the metal layer in electrical communication with the active layer.

In another example, a die includes an active layer on a first side of a semiconductor substrate, an active device in the active layer, a metal layer on a second side of the semiconductor substrate, a passive device in the metal layer, and means for providing electrical communication between the active device and the passive device through the semiconductor substrate, where the means for providing electrical communication can include one or more Through Silicon Vias (TSVs).

Another example includes a method for manufacturing a semiconductor device. The layers are disposed so that there is a metal layer on a first side of a semiconductor substrate and an active layer disposed on a second side of the semiconductor substrate. Active devices are disposed within the active layer, and one or more passive devices are disposed in the metal layer. Electrical connections are made between the one or more passive devices and the one or more active devices.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawings.

DETAILED DESCRIPTION

Through Silicon Vias (TSVs) are a very new technology and are currently being used in various applications. As their name suggests, TSVs are generally substantially vertical interconnects used to make electrical connections through a semiconductor. TSVs can be used to connect devices within the same die or in different but adjacent (e.g., stacked) dies.

Various embodiments of the invention use TSVs (and/or other structures) to facilitate a novel arrangement of active and passive devices within a die.

Figure 3:
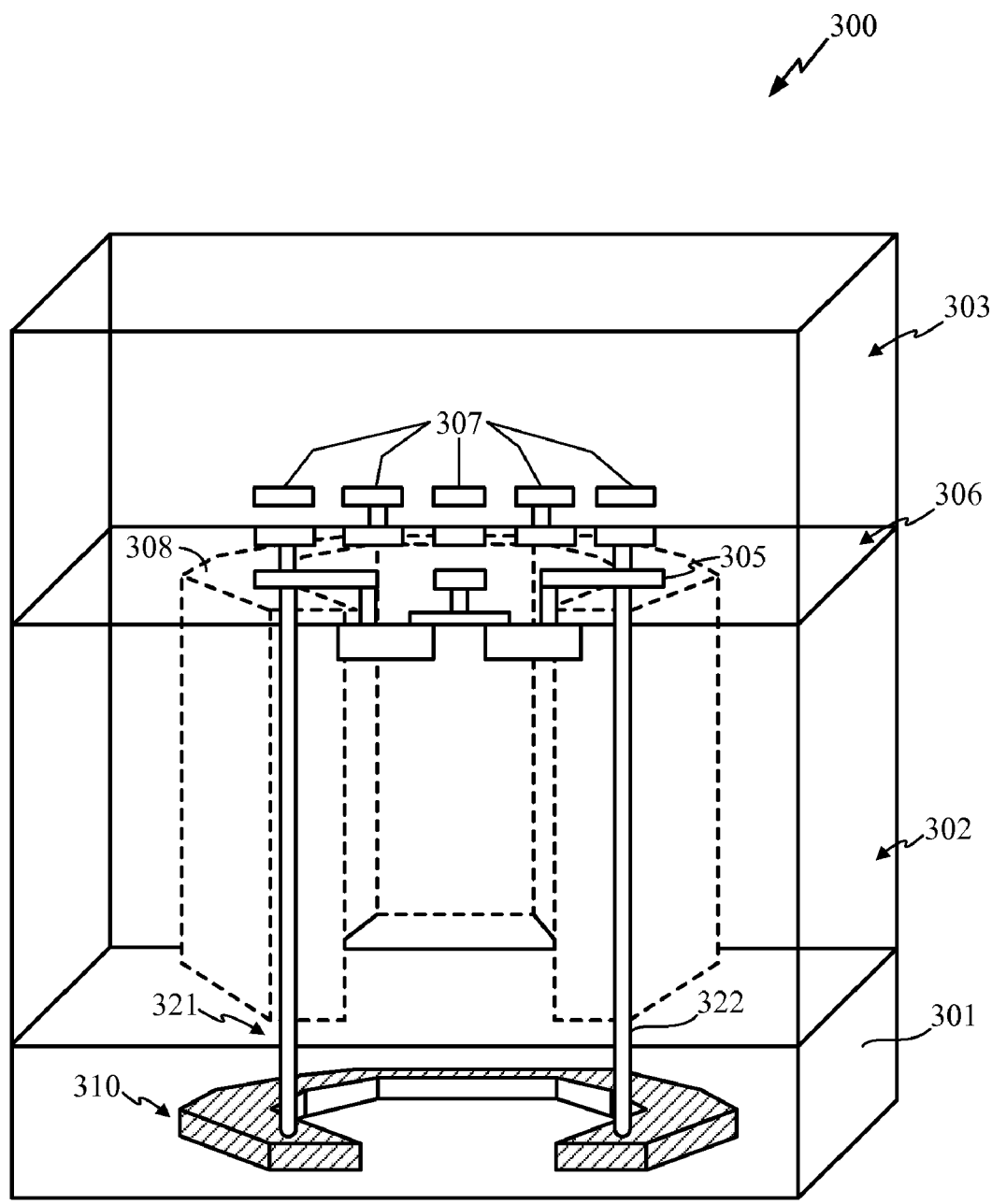
FIG. 3 is an illustration of an exemplary design adapted according to one embodiment of the invention.

FIG. 3 is an illustration of an exemplary design 300 adapted according to one embodiment of the invention, and it shows a cross-section of a die. The design 300 includes the RDL 301, the substrate 302 (for example a silicon substrate), and the BEOL raised metal layers 303. The active layer 306 is disposed on top of the substrate 302 and includes a multitude of active devices, one of such active devices shown as the device 305. The design 300 also includes the passive devices 307, which are disposed in the raised metal layers 303.

Figure 1:
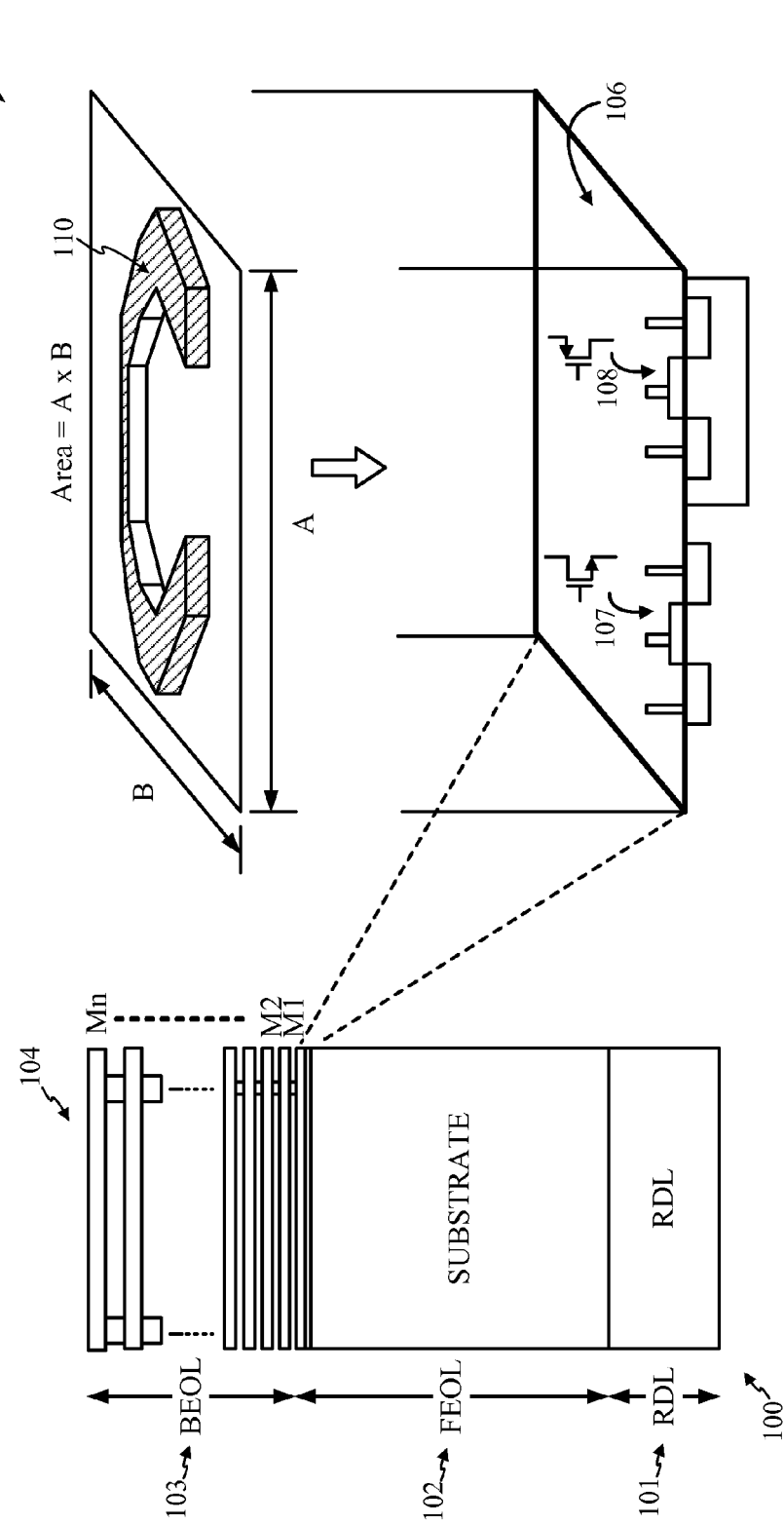
FIG. 1 is an illustration of a conventional CMOS design.
Figure 2:
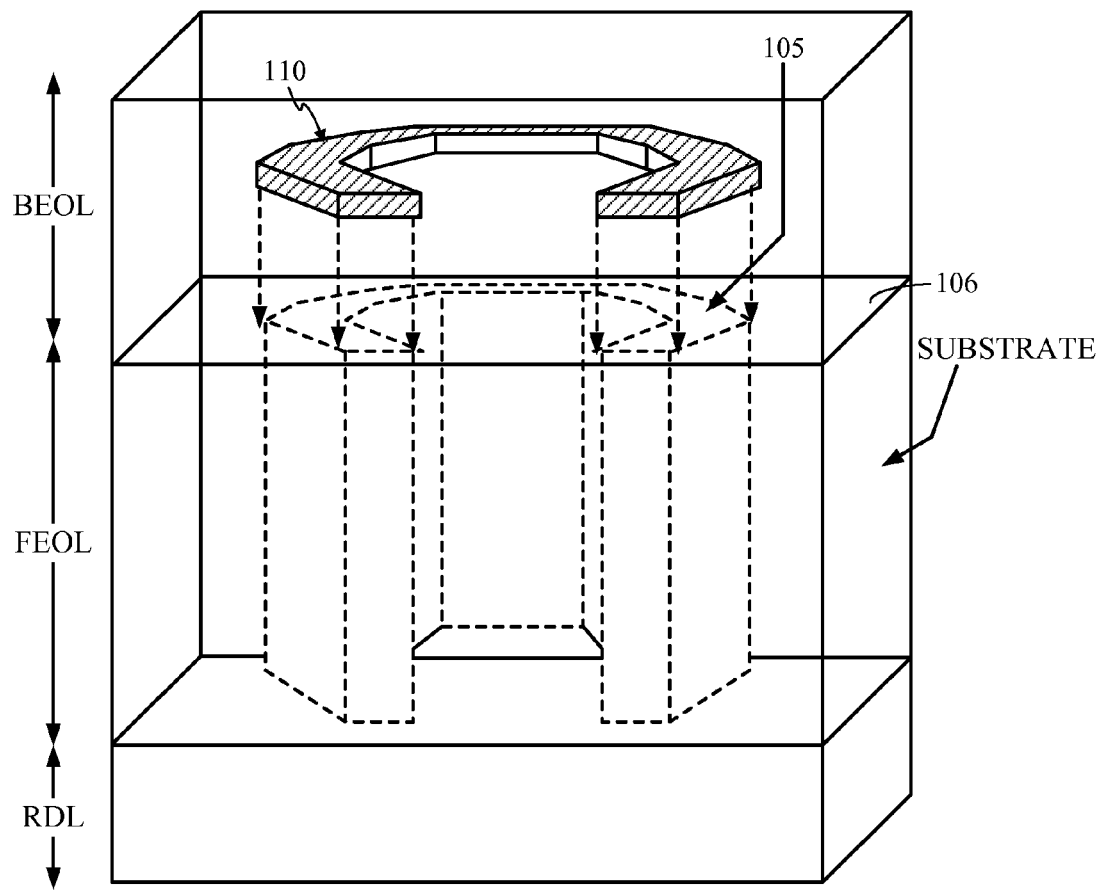
FIG. 2 is an illustration showing a simplified version of the conventional design showing a placement of an inductor within a BEOL metal stack.

The design 300 further includes a passive device, in this example, the on-chip inductor 310. The on-chip inductor 310 is fabricated in the RDL 301 and is connected electrically to the active device 305 by TSVs 321 and 322. The design 300 differs from the design 100 (FIGS. 1 and 2) in that it uses the RDL 301, rather than the BEOL metal layers 303, to implement the inductor 310. As a result, the active layer 306 is shielded from the inductor 310 by the substrate 302. In the design 300, the presence of the inductor 310 should not impede placement of the active device 305 anywhere within the active layer 306, even the area 308 of the active layer 306 that is directly above the inductor 310.

In an embodiment wherein the inductor 310 has approximate dimensions of three hundred microns by three hundred microns, and some of the active devices are as large as about one micron by one micron and others are as small as about 0.3 microns by 0.3 microns, the design 300 can implement approximately 1,000,000 active devices within the otherwise unusable area 308 of the active layer 306. In fact, the active layer 306 can host any of a variety of devices, such as transistors, memory components, and the like.

In an embodiment wherein the distance between the inductor 310 and the active layer 306 is between fifty and two hundred microns, and wherein the substrate 302 has a resistivity of one ohm/centimeter, the amount of shielding provided by the substrate 302 can be substantial. By comparison, prior art designs (such as those of FIGS. 1 and 2) place an inductor in the BEOL metal layers within about two to five microns from the active layer.

The design 300 uses the TSVs 321 and 322 to connect the inductor 310 to the active device 305. A property of the design 300 is that the lengths of the TSVs 321 and 322 (or at least a portion thereof) electrically act as part of the inductor 310, and thereby contribute to the value of inductance of the inductor 310. Thus, an engineer takes into account the lengths of TSVs 321 and 322 when calculating the value of inductance. A benefit of some embodiments is that the lengths of the TSVs 321 and 322 allow for an inductor with a smaller area to be used for a given inductance value.

The devices 307 can also be coupled to the inductor 310 using the TSVs 321 and 322. For instance, the devices 307 can be coupled to conductive pads in the active layer 306, which include connections to the TSVs 321 and 322.

While the above examples provide specific values for some physical properties, the invention is not so limited. In fact, some embodiments can be adapted to any of a variety of applications that have different dimensional values, as well as different materials (e.g., Silicon On Insulator technology, which includes an SiO2 layer in the FEOL layer). Similarly, other passive devices, such as capacitors, can be used in some embodiments instead of, or in addition to, inductors.

Figure 4:
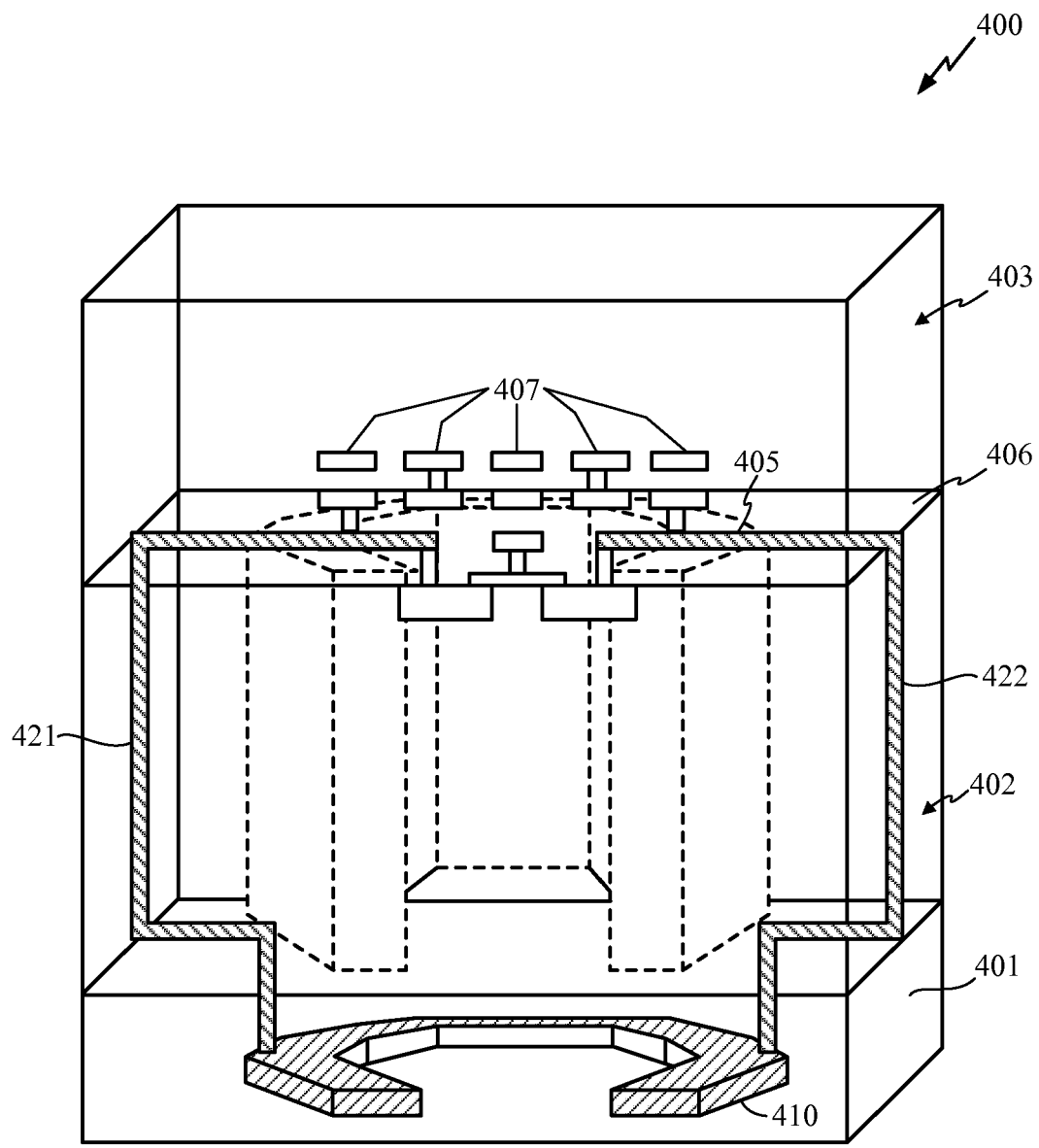
FIG. 4 is an illustration of an exemplary design adapted according to one embodiment of the invention.

FIG. 4 is an illustration of the exemplary design 400 adapted according to one embodiment of the invention. The design 400 includes the BEOL raised metal layers 403, the substrate 402, the RDL 401, the active layer 406, the active devices 405 (in the active layer 406), the device 407 (in the BEOL raised metal layers 403), and the inductor 410. Once again, the inductor 410 is manufactured in the RDL 401 rather than in the BEOL raised metal layers 403. The design 400 employs metal traces 421 and 422 to connect the inductor 410 to the active device 405. The metal traces 421 and 422 do not penetrate the substrate 402, but rather, follow a path around the substrate 402 on the outside of the die and make connections in the active layer 406. Traces, such as the traces 421 and 422 can also be used to make connections to the devices 407 by connecting the devices 407 to the traces on the active layer 406. Various embodiments can use TSVs (as in FIG. 3), side traces (as in FIG. 4), other techniques, or a combination thereof to connect a passive device in a RDL metal layer to an active layer.

Figure 5:
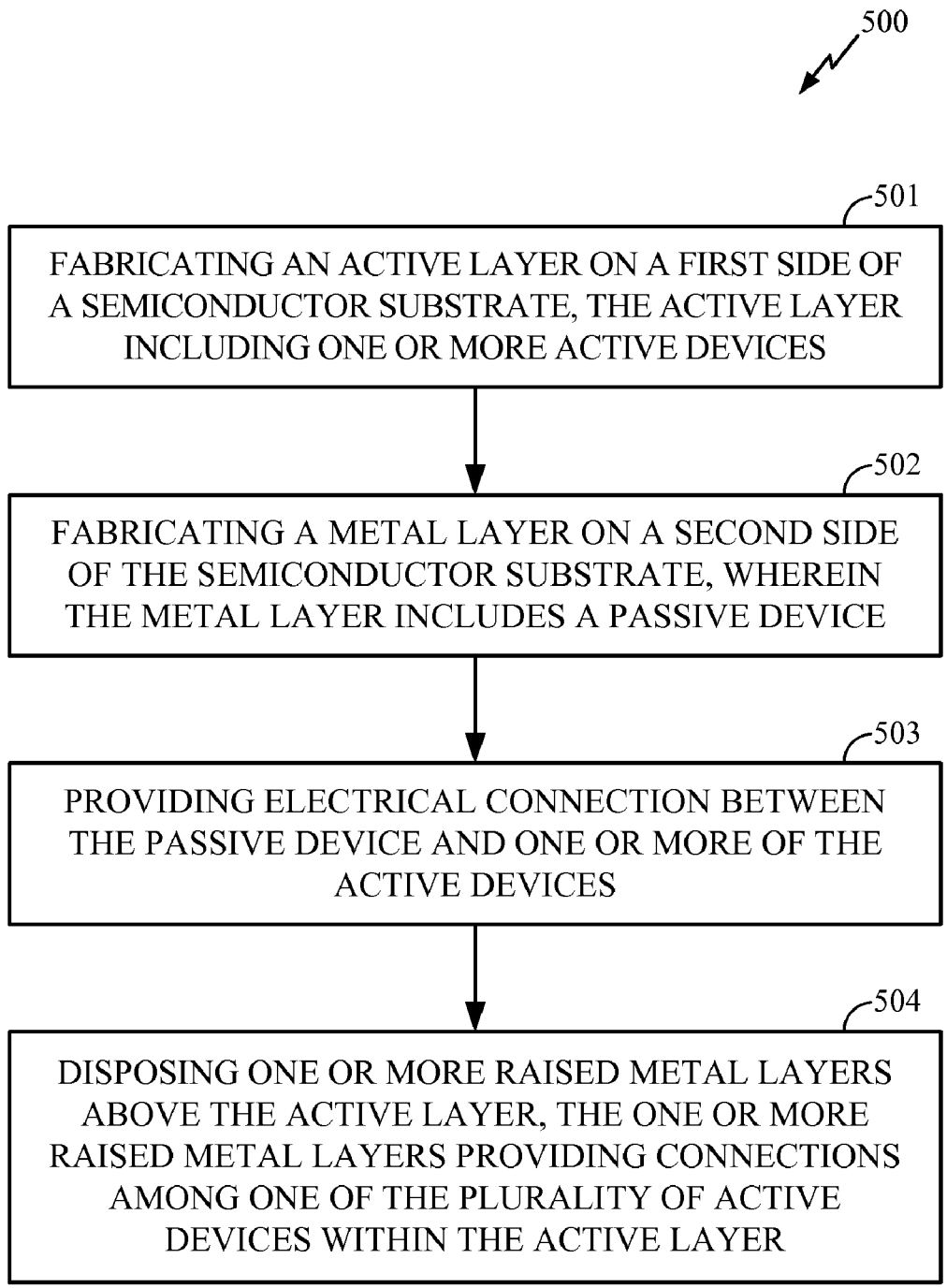
FIG. 5 is an illustration of an exemplary method adapted according to one embodiment of the invention.

FIG. 5 is an illustration of the exemplary method 500 adapted according to one embodiment of the invention. The method 500 is one technique for fabricating a die, such as the dies in the designs of FIGS. 3 and 4.

In the block 501, an active layer is fabricated on a first side of a semiconductor substrate, the active layer including one or more active devices. Active devices include, but are not limited to, transistors. The active layer and the active devices can be fabricated on the substrate using any method now known or later developed, and various embodiments of the invention are not limited to any technique of fabricating the active devices and the active layer.

In the block 502, a metal layer is fabricated on a second side of the semiconductor substrate, wherein the metal layer includes a passive device. In one example, the metal layer is a metal oxide RDL, and the passive device is an inductor. However, the invention is not so limited. For instance, the passive device can be a capacitor or other device such as a resistor. Furthermore, the metal layer and the passive device can be fabricated using any method now known or later developed, and various embodiments of the invention are not limited to any technique of fabricating the passive device and metal layer.

In the block 503, electrical connection is provided between the passive device and one or more of the active devices. In one example, TSVs are used to make electrical connections through the substrate. In another example, metal traces on the outside of the die provide electrical connections. The scope of embodiments is not limited to any particular technique for providing electrical connections, and some example techniques are discussed below.

In the block 504, one or more BEOL raised metal layers are disposed above the active layer. In this example, the one or more BEOL metal layers provide connections among various active devices within the active layer. The BEOL metal layers can be fabricated using any method now known or later developed, and various embodiments of the invention are not limited to any technique of fabricating the BEOL metal layers. Various embodiments of the invention do not exclude placing passive devices in the BEOL metal layers, as an embodiment can also include passive devices in the BEOL metal layers in addition to passive devices in the metal layer on the other side of the substrate (e.g., RDL). For example, when a given passive device cannot be fabricated in the RDL, it may be fabricated in one or more of the BEOL metal layers.

While the method 500 is shown as a series of discrete blocks, the invention is not so limited. Various embodiments may add, omit, modify, or rearrange the actions of the blocks 501-504. For instance, fabricating the passive device in the metal layer can be performed in a different step from fabricating the metal layer itself. In fact, any method for fabricating dies according to the designs of FIGS. 3-4 can be used, including, e.g., a via first technique and the via last technique.

The via first method involves forming the TSVs in a substrate before other fabrication of circuitry occurs. A pattern of vias is etched or drilled into a fraction of the depth of the base substrate. The vias are then filled with an insulating layer and conducting material, and circuit fabrication follows. The back side of the substrate containing the TSVs is ground down to expose the TSVs.

In the via last method, circuitry fabrication takes place before the TSVs are formed. The circuitry contains interconnect pads that will be coupling points for the TSVs. TSVs are created by either etching or drilling into the pad through the depth of the substrate or etching or drilling from the back side of the substrate to the pad. The TSV is then filled with an insulating barrier and conducting material.

Using a via first technique, the front end of the line processing is performed first, then the vias are fabricated, followed by the back end of the line processing. Using the via last approach, the front end of the line processing is performed first, then back end of the line processing is performed, then vias are made through the stack. Various embodiments of the invention are not limited to any particular method for fabricating TSVs, as any method now known or later developed to fabricate TSVs can be used. Moreover, although the terminology "through silicon via" includes the word silicon, it is noted that through silicon vias are not necessarily constructed in silicon. Rather, the material can be any device substrate material.

Figure 6:
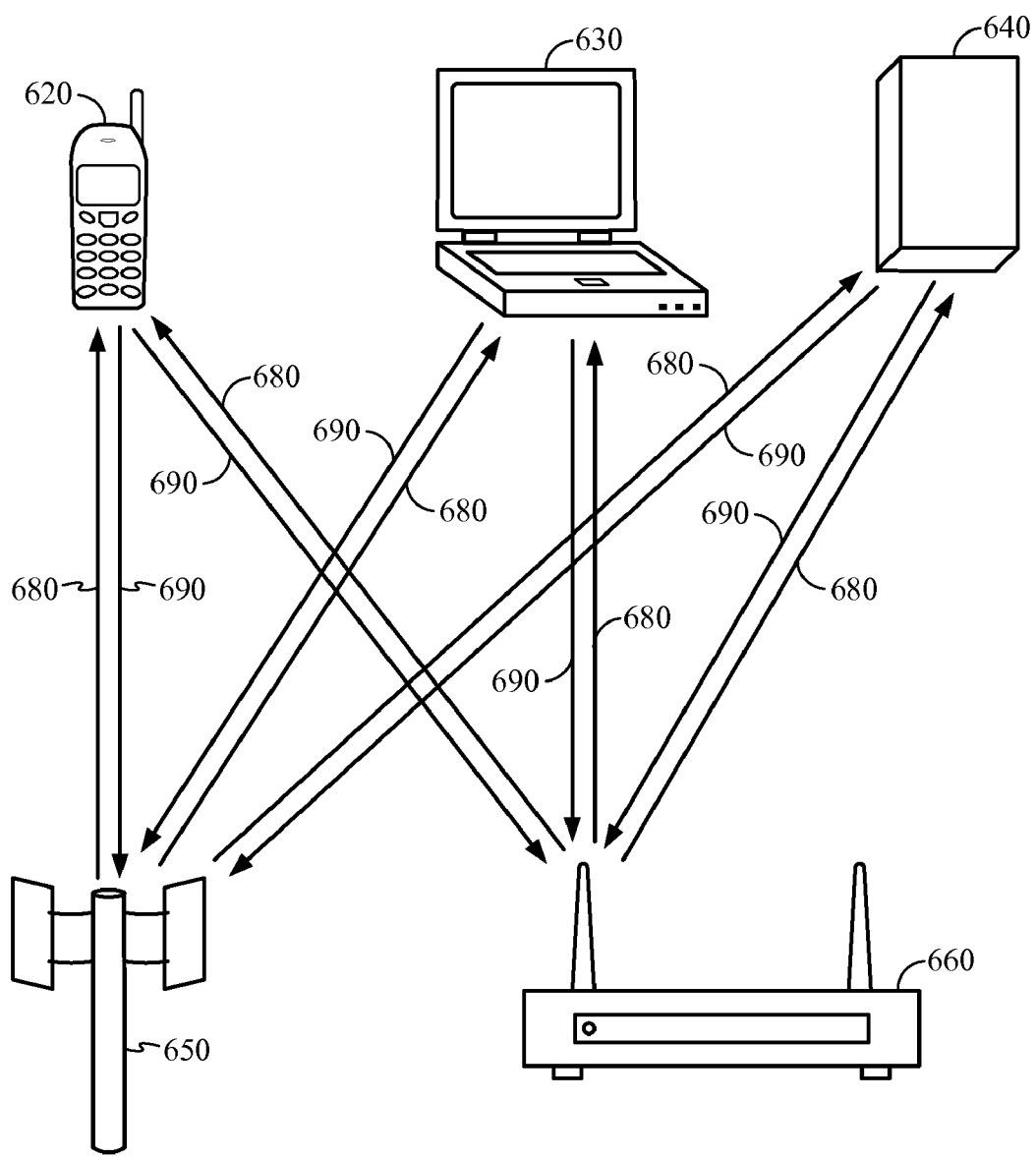
FIG. 6 shows an exemplary wireless communication system in which an embodiment of the invention may be advantageously employed.

FIG. 6 shows an exemplary wireless communication system 600 in which an embodiment of the invention may be advantageously employed. For purposes of illustration, FIG. 6 shows three remote units 620, 630, and 640 and two base stations 650, 660. It will be recognized that typical wireless communication systems may have many more remote units and base stations. The remote units 620, 630, and 640 can include any of a variety of components, such as memory units, Analog to Digital Converters (ADCs), Digital to Analog Converters (DACs), processors, delta sigma data converters, and the like. Embodiments of the invention can find use in various semiconductor chip-based components, such as Radio Frequency (RF) circuits and semiconductor chips which use stacked dies. FIG. 6 shows forward link signals 680 from the base stations 650, 660 to the remote units 620, 630, and 640 and the reverse link signals 690 from the remote units 620, 630, and 640 to the base stations 650, 660.

Generally, remote units may include cell phones, handheld personal communication systems (PCS) units, portable data units such as personal data assistants, fixed location data units such as meter reading equipment, and/or the like. In FIG. 6, the remote unit 620 is shown as a mobile telephone, the remote unit 630 is shown as a portable computer, and the remote unit 640 is shown as a fixed location remote unit in a wireless local loop system. The base stations 650, 660 can be any of a variety of wireless base stations, including, e.g., cellular telephone base stations, wireless network access points (e.g., IEEE 802.11 compliant access points), and the like. Although FIG. 6 illustrates remote units according to the teachings of the invention, the invention is not limited to these exemplary illustrated units.

Although specific circuitry has been set forth, it will be appreciated by those skilled in the art that not all of the disclosed circuitry is required to practice the invention. Moreover, certain well known circuits have not been described, to maintain focus on the invention. Similarly, although the description refers to logical "0" and logical "1" in certain locations, one skilled in the art appreciates that the logical values can be switched, with the remainder of the circuit adjusted accordingly, without affecting operation of the present invention.

One advantage of some embodiment is that fabricating a device in the RDL offers an enhanced degree of freedom because the thickness of the RDL can be varied. Thus, in many embodiments, the thickness of the RDL can be varied from one micron to ten microns and thicker in some embodiments, thereby providing greater flexibility in designing thicknesses of passive devices. In other words, greater flexibility of design is gained because there are fewer constraints on thickness in the RDL.

Another advantage of some embodiments is cost savings. For instance, some or all increased cost attributable to fabricating a passive device in the RDL may be offset by the use of a smaller die, made possible by less wasted space. Wasted space is a concern, especially in designs that use a multitude of passive devices, such as Radio Frequency (RF) circuits, which may have ten or more inductors on a die. Such devices can benefit from various embodiments of the invention.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:
1. A semiconductor die comprising:
    a semiconductive substrate layer with first and second sides;
    a metal layer adjacent said second side of said semiconductive substrate layer;
    an active layer disposed on said first side of said semiconductive substrate layer; and
    a passive device embedded within the metal layer adapted to be coupled to said active layer.
2. The semiconductor die of claim 1 wherein said passive device comprises an inductor.
3. The semiconductor die of claim 1 wherein said passive device comprises a capacitor.
4. The semiconductor die of claim 1 wherein said active layer comprises an active device, and wherein said active device comprises a transistor.
5. The semiconductor die of claim 1 further comprising:
    a through via providing an electrical coupling between said passive device and said active layer.
6. The semiconductor die of claim 5 wherein said through via penetrates said substrate through at least fifty microns of substrate material.
7. The semiconductor die of claim 1 further comprising:
    a trace on an outside surface of said die providing electrical coupling between said passive device and said active layer.

8. The semiconductor die of claim 1 further comprising:
a plurality of raised metal layers arranged over said active layer.

9. The semiconductor die of claim 1 further comprising one or more active devices disposed in said active layer within an area directly above an area of said passive device.

10. A die comprising:
an active layer on a first side of a semiconductor substrate;
a metal layer on a second side of said semiconductor substrate;
a passive device embedded within said metal layer; and
means for providing electrical communication between said active layer and said passive device through said semiconductor substrate.

11. The die of claim 10 wherein said passive device is selected from the list consisting of:
an inductor; and
a capacitor.

12. The die of claim 10 wherein said metal layer comprises metal oxide.

13. The die of claim 10 further comprising:
a raised metal layer above said active layer providing electrical connection among active devices of said active layer.

* * * * *